United States Patent
Chae et al.

(10) Patent No.: US 10,705,145 B2
(45) Date of Patent: Jul. 7, 2020

(54) APPARATUS AND METHOD FOR EXTRACTING IMPEDANCE PARAMETERS OF THREE-PHASE MOTOR

(71) Applicants: Hyundai Motor Company, Seoul (KR); Kia Motors Corporation, Seoul (KR); UNIST (Ulsan National Institute of Science and Technology), Ulsan (KR)

(72) Inventors: Woong Chan Chae, Gyeonggi-do (KR); Sang Hoon Moon, Gyeonggi-do (KR); Jung Shik Kim, Seoul (KR); Young Jin Shin, Gyeongsangnam-do (KR); Hyoung Jun Cho, Gyeonggi-do (KR); Young Gon Ryu, Ulsan (KR); Ki Jin Han, Seoul (KR)

(73) Assignees: Hyundai Motor Company, Seoul (KR); Kia Motors Corporation, Seoul (KR); UNIST (Ulsan National Institute of Science and Technology), Ulsan (KR)

( * ) Notice: Subject to any disclaimer, the term of this patent is extended or adjusted under 35 U.S.C. 154(b) by 79 days.

(21) Appl. No.: 16/184,340

(22) Filed: Nov. 8, 2018

(65) Prior Publication Data
US 2019/0170825 A1    Jun. 6, 2019

(30) Foreign Application Priority Data
Dec. 1, 2017   (KR) .................. 10-2017-0164202

(51) Int. Cl.
*G01R 31/34* (2020.01)
*G01R 27/02* (2006.01)

(52) U.S. Cl.
CPC ........... *G01R 31/346* (2013.01); *G01R 27/02* (2013.01); *G01R 31/343* (2013.01)

(58) Field of Classification Search
CPC .... G01R 27/02; G01R 31/343; G01R 31/346; G01R 31/34; G01R 27/08
(Continued)

(56) References Cited

U.S. PATENT DOCUMENTS

| 6,172,509 B1* | 1/2001 | Cash .................... G01R 31/346 318/434 |
| 2008/0129243 A1* | 6/2008 | Nashiki .................. H02K 1/145 318/701 |

(Continued)

OTHER PUBLICATIONS

Dorrell, D.G., Analysis of Split-Phase Induction Motors Using an Impedance Matrix, 2 PEMD 811-816 (2004) (Year: 2004).*

(Continued)

*Primary Examiner* — Tung X Nguyen
*Assistant Examiner* — Robert P Alejnikov, Jr.
(74) *Attorney, Agent, or Firm* — Mintz Levin Cohn Ferris Glovsky and Popeo, P.C.; Peter F. Corless (57) ABSTRACT

A method of extracting impedance parameters of a three-phase motor utilizes a five-terminal network including first to third winding wires and opposite shaft ends. The method includes connecting two terminals, selected from among the winding wires and the shaft ends, to input and output terminals in order to measure voltage and current of the terminals and to extract input impedance parameters of the five-terminal network, extracting conversion parameters including voltage and current transfer matrices in a common mode, in which the winding wires are commonly connected to the input and output terminals, and in a differential mode, in which the winding wires are differentially connected to the input and output terminals, and calculating impedance parameters in a mixed mode, in which transfer impedance components for the shaft ends in the common mode and the differential mode are mixed, using the extracted input impedance parameters and conversion parameters.

14 Claims, 4 Drawing Sheets

|  | SHAFT 1 | SHAFT 2 | COMMON MODE | DIFFERENTIAL MODE (U) | DIFFERENTIAL MODE (V) |
|---|---|---|---|---|---|
| SHAFT 1 | $Z_{shaft1,shaft1}$ | $Z_{shaft1,shaft2}$ | $Z_{shaft1,CM}$ | $Z_{shaft1,DM-U}$ | $Z_{shaft1,DM-V}$ |
| SHAFT 2 | $Z_{shaft2,shaft1}$ | $Z_{shaft2,shaft2}$ | $Z_{shaft2,CM}$ | $Z_{shaft2,DM-U}$ | $Z_{shaft2,DM-V}$ |
| COMMON MODE | $Z_{CM,shaft1}$ | $Z_{CM,shaft2}$ | $Z_{CM,CM}$ | $Z_{CM,DM-U}$ | $Z_{CM,DM-V}$ |
| DIFFERENTIAL MODE (U) | $Z_{DM-U,shaft1}$ | $Z_{DM-U,shaft2}$ | $Z_{DM-U,CM}$ | $Z_{DM-U,DM-U}$ | $Z_{DM-U,DM-V}$ |
| DIFFERENTIAL MODE (V) | $Z_{DM-V,shaft1}$ | $Z_{DM-V,shaft2}$ | $Z_{DM-V,CM}$ | $Z_{DM-V,DM-U}$ | $Z_{DM-V,DM-V}$ |

(58) Field of Classification Search
USPC .................................................. 324/765.01
See application file for complete search history.

(56) References Cited

U.S. PATENT DOCUMENTS

| | | | | |
|---|---|---|---|---|
| 2008/0174255 A1* | 7/2008 | Schnetzka | ............. | F25B 49/025 |
| | | | | 318/12 |
| 2008/0264673 A1* | 10/2008 | Chi | ....................... | G06F 13/409 |
| | | | | 174/250 |
| 2009/0267431 A1* | 10/2009 | Tallam | .................. | H02M 1/126 |
| | | | | 310/71 |
| 2015/0102882 A1* | 4/2015 | Shudarek | ................ | H01F 37/00 |
| | | | | 336/10 |

OTHER PUBLICATIONS

Henze, O., et al., A Network Modle for Inverter-Fed Induction-Motor Drives, 2007 Euro. Conf. Power Elecs. & Appls. (Aalborg, Denmark; Sep. 2-5, 2007) (Year: 2007).*

Kim, Y., et al., Analysis of a disk-type stator for the piezoelectric ultrasonic motor using impedance matrix, 263 J. Sound & Vibration 643-663 (Jun. 2003) (Year: 2003).*

Tallam, R., et al., Integrated Differential-Mode and Common-Mode Filter to Mitigate the Effects of Long Motor Leads on AC Drives, 47 IEEE Trans. on Industry Appls. 2075-2083 (Sep./Oct. 2011) (Year: 2011).*

* cited by examiner

| | SHAFT 1 | SHAFT 2 | COMMON MODE | DIFFERENTIAL MODE (U) | DIFFERENTIAL MODE (V) |
|---|---|---|---|---|---|
| SHAFT 1 | $Z_{shaft1,shaft1}$ | $Z_{shaft1,shaft2}$ | $Z_{shaft1,CM}$ | $Z_{shaft1,DM-U}$ | $Z_{shaft1,DM-V}$ |
| SHAFT 2 | $Z_{shaft2,shaft1}$ | $Z_{shaft2,shaft2}$ | $Z_{shaft2,CM}$ | $Z_{shaft2,DM-U}$ | $Z_{shaft2,DM-V}$ |
| COMMON MODE | $Z_{CM,shaft1}$ | $Z_{CM,shaft2}$ | $Z_{CM,CM}$ | $Z_{CM,DM-U}$ | $Z_{CM,DM-V}$ |
| DIFFERENTIAL MODE (U) | $Z_{DM-U,shaft1}$ | $Z_{DM-U,shaft2}$ | $Z_{DM-U,CM}$ | $Z_{DM-U,DM-U}$ | $Z_{DM-U,DM-V}$ |
| DIFFERENTIAL MODE (V) | $Z_{DM-V,shaft1}$ | $Z_{DM-V,shaft2}$ | $Z_{DM-V,CM}$ | $Z_{DM-V,DM-U}$ | $Z_{DM-V,DM-V}$ |

510 (highlighted region: SHAFT 1 and SHAFT 2 rows, COMMON MODE / DIFFERENTIAL MODE (U) / DIFFERENTIAL MODE (V) columns)

520 (highlighted region: DIFFERENTIAL MODE (U) and DIFFERENTIAL MODE (V) rows, SHAFT 1 and SHAFT 2 columns)

APPARATUS AND METHOD FOR EXTRACTING IMPEDANCE PARAMETERS OF THREE-PHASE MOTOR

CROSS-REFERENCE TO RELATED APPLICATION(S)

This application claims under 35 U.S.C. § 119(a) the benefit of Korean Patent Application No. 10-2017-0164202, filed on Dec. 1, 2017, the entire contents of which are incorporated by reference herein.

BACKGROUND

(a) Technical Field

The present disclosure relates to an apparatus and method for extracting impedance parameters of a three-phase motor so as to extract an extent to which electrical noise generated from the three-phase motor in a common mode and a differential mode is transferred to a shaft in the form of network parameters.

(b) Description of the Related Art

With the expanded use of pulse width modulation (PWM) for controlling the speed of a motor, it has become increasingly necessary to address an electromagnetic interference (EMI) problem of a motor-driving system due to high-frequency electromagnetic noise generated in a switching pulse.

In the driving system, the motor includes a plurality of winding wires, through which electrical noise generated by the switching of an inverter is mainly transmitted to the system. In particular, since a shaft of the motor is mechanically connected to another device, voltage and current applied to the shaft directly transmit the electrical noise to the system, whereby the system is subject to malfunctioning. Shaft voltage is known to be mainly generated due to electrical noise transmitted due to parasitic coupling components of a winding wire structure of the motor in a common mode and a differential mode.

The electrical noise in the common mode is transmitted through parasitic coupling components between three-phase winding wires and a ground (generally, a frame of the motor), and the electrical noise in the differential mode is transmitted through parasitic coupling components generated between three-phase winding wires.

The electrical noise in the common mode and the differential mode causes dielectric breakdown of the motor, and is transmitted to external devices, particularly through the shaft.

It is possible to measure electrical noise transmitted to the shaft through experimentation, but it is difficult to extract quantitative data indicating the extent to which overall conductive noise generated from the motor is transmitted to the shaft. Conventionally, therefore, motor designers have used a method of additionally installing a filter in the driving system or a method of grounding the opposite ends of the shaft through brushes in order to simply reduce the amount of electrical noise generated from the motor without appropriate analysis of coupling between the electrical noise and the shaft when shaft voltage generated due to conductive noise affects the system.

However, the method of reducing the amount of electrical noise without appropriate cause analysis has disadvantages in that the volume and cost of the driving system are increased as the result of using the filter. In addition, the grounding method using the brushes has disadvantages in that the lifespan of the motor is reduced as the result of wear due to mechanical contact, and the stability of the system is reduced due to sparking. Therefore, there is a need for an apparatus that is capable of extracting parameters through which overall conductive noise generated from the motor is transmitted to the shaft as data in order for motor designers or users to optimally design the motor in consideration of electromagnetic suitability without using conventional methods.

SUMMARY

Accordingly, the present disclosure is directed to an apparatus and method for extracting impedance parameters of a three-phase motor.

The present disclosure provides an apparatus and method for extracting electrical noise generated from a three-phase motor in a common mode and a differential mode and extracting an extent to which the electrical noise is transferred to a shaft in the form of network parameters.

According to the present disclosure, a method of extracting impedance parameters of a three-phase motor, constituted by a five-terminal network including first to third winding wires and opposite shaft ends, includes connecting two terminals, selected from among the first to third winding wires and the opposite shaft ends of the three-phase motor, to an input terminal and an output terminal in order to measure voltage and current of the two terminals and to extract input impedance parameters of the five-terminal network (a first step), extracting conversion parameters including voltage and current transfer matrices in a common mode, in which the first to third winding wires are commonly connected to the input terminal and the output terminal, and in a differential mode, in which the first to third winding wires are differentially connected to the input terminal and the output terminal (a second step), and calculating impedance parameters in a mixed mode, in which transfer impedance components for the opposite shaft ends in the common mode and the differential mode are mixed, using the input impedance parameters and the conversion parameters extracted at the first and second steps (a third step). In another aspect of the present disclosure, a non-transitory computer-readable recording medium containing program instructions executed by a processor includes: program instructions that connect two terminals, selected from among first to third winding wires and opposite shaft ends of a three-phase motor, to an input terminal and an output terminal in order to measure voltage and current of the two terminals and to extract input impedance parameters of a five-terminal network; program instructions that extract conversion parameters comprising voltage and current transfer matrices in a common mode, in which the first to third winding wires are commonly connected to the input terminal and the output terminal, and in a differential mode, in which the first to third winding wires are differentially connected to the input terminal and the output terminal; and program instructions that calculate impedance parameters in a mixed mode, in which transfer impedance components for the opposite shaft ends in the common mode and the differential mode are mixed, using the input impedance parameters and the conversion parameters, extracted at the steps of connecting the two terminals and extracting the conversion parameters In a further aspect of the present disclosure, an apparatus for extracting impedance parameters of a three-phase motor constituted by a five-terminal network comprising first to third winding wires and opposite shaft ends includes a measurement unit for connecting two terminals, selected from among the first to third winding wires and opposite shaft ends of the three-phase motor, to an input terminal and an output terminal in order to measure voltage and current of the two terminals, a parameter extraction unit for extracting input impedance parameters of the five-terminal network and conversion parameters including voltage and current transfer matrices in a common mode, in which the first to third winding wires are commonly connected to the input terminal and the output terminal, and in a differential mode, in which the first to third winding wires are differentially connected to the input terminal and the output terminal, and a parameter calculation unit for calculating impedance parameters in a mixed mode, in which transfer impedance components for the opposite shaft ends in the common mode and the differential mode are mixed, using the input impedance parameters and the conversion parameters, extracted by the parameter extraction unit.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE DISCLOSURE

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

In addition, in the following description of the embodiments disclosed herein, a detailed description of related known technologies will be omitted when it may make the subject matter of the embodiments disclosed herein rather unclear. Further, the accompanying drawings have been made only for a better understanding of the embodiments disclosed herein and are not intended to limit the technical ideas disclosed herein, and it should be understood that the accompanying drawings are intended to encompass all modifications, equivalents, and substitutions included in the spirit and scope of the present disclosure.

Hereinafter, embodiments of an apparatus and method for extracting impedance parameters of a three-phase motor according to the present disclosure will be described in detail with reference to the accompanying drawings.

Figure 1:
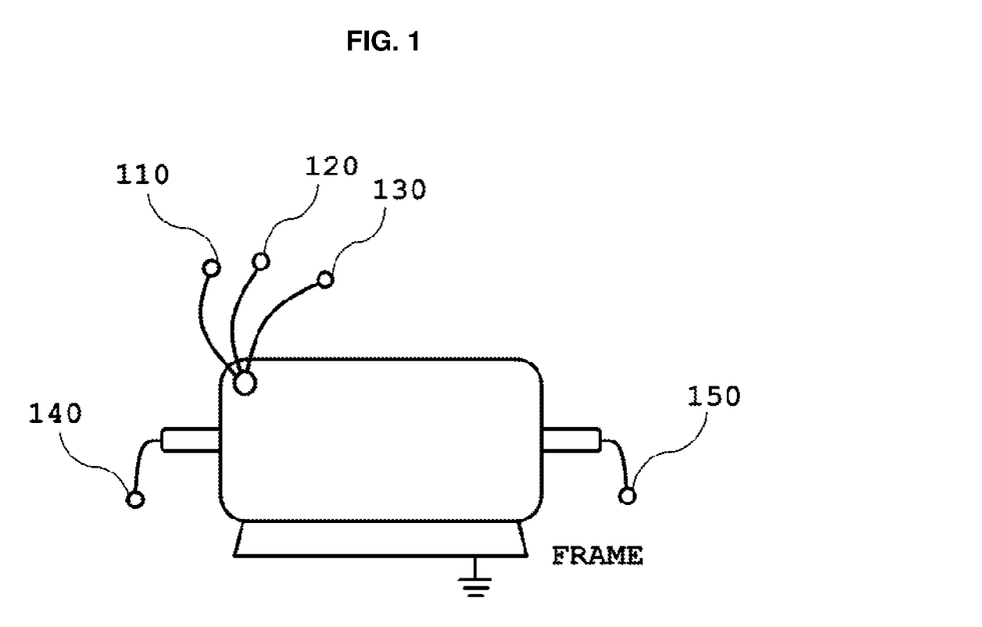
FIG. 1 is a schematic diagram illustrating the construction of a five-terminal network of a three-phase motor according to the present disclosure.

FIG. 1 is a schematic diagram illustrating the construction of a five-terminal network of a three-phase motor according to the present disclosure.

Referring to FIG. 1, a three-phase motor according to an embodiment of the present disclosure may be constituted by a five-terminal network including a first winding wire 110 (U-phase), a second winding wire 120 (V-phase), a third winding wire 130 (W-phase), and opposite shaft ends 140 and 150.

Figure 2:
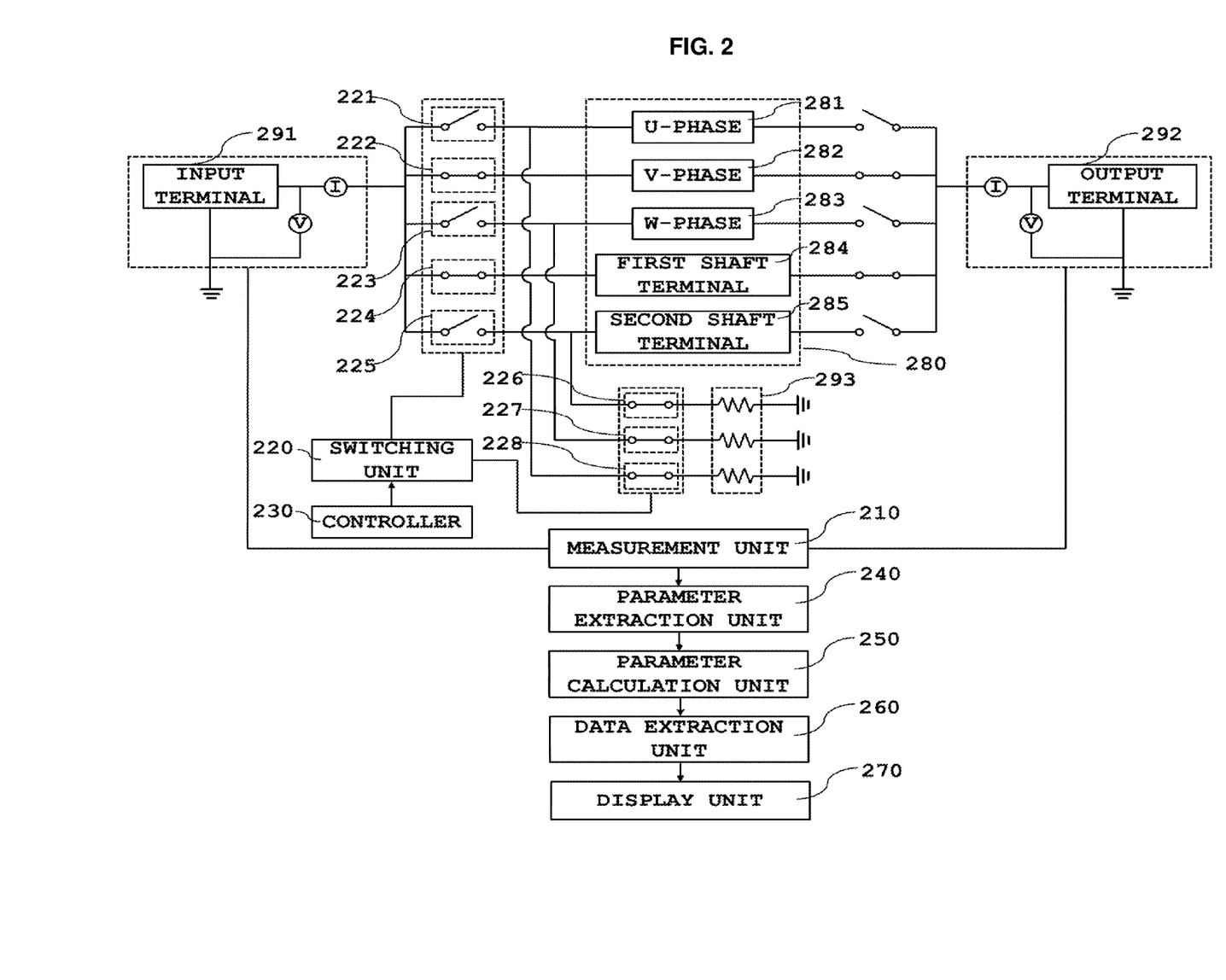
FIG. 2 is a block diagram showing an apparatus for extracting impedance parameters of a three-phase motor according to the present disclosure.

FIG. 2 is a block diagram showing an apparatus for extracting impedance parameters of a three-phase motor according to the present disclosure.

Referring to FIG. 2, an apparatus for extracting impedance parameters of a three-phase motor according to an embodiment of the present disclosure may include a measurement unit 210, a switching unit 220, a controller 230, a parameter extraction unit 240, a parameter calculation unit 250, a data extraction unit 260, and a display unit 270.

The measurement unit 210 selectively measures voltages and currents of two terminals of a three-phase motor 280, which is constituted by a five-terminal network including first to third wires 281 to 283 and opposite shaft ends 284 and 285.

The switching unit 220 may include a plurality of first conversion switches 221 to 225 for connecting the first to third wires 281 to 283 and the opposite shaft ends 284 and 285 of the three-phase motor 280 to input and output terminals 291 and 292, and a plurality of second conversion switches 226 to 228 for grounding the first to third wires 281 to 283 and the opposite shaft ends 284 and 285 of the three-phase motor 280 through a reference impedance 293.

The controller 230 may control the switching unit 220 to switch the first conversion switches 221 to 225 such that the input and output terminals 291 and 292 are selectively disconnected from or connected to the first to third wires 281 to 283 and the opposite shaft ends 284 and 285 of the three-phase motor 280.

In addition, the controller 230 may switch the second conversion switches 226 to 228 to ground the other terminals of the five-terminal network of the three-phase motor 280, excluding two terminals, which are selected targets to be measured, through the reference impedance 293.

For example, referring to an example shown in FIG. 2, the controller turns on 1-2 and 1-4 conversion switches 222 and 224, among the first conversion switches 221 to 225, to connect the input terminal 291 and the output terminal 292 to the second winding wire 282 and the first shaft terminal 284, and the measurement unit 210 measures terminal voltages and terminal currents of the second winding wire 282 and the first shaft terminal 284.

The controller 230 may turn off 1-1, 1-3, and 1-5 conversion switches 221, 223, and 225, among the first conversion switches 221 to 225, to disconnect the first winding wire 281, the third winding wire 283, and the second shaft terminal 285, excluding the second winding wire 282 and the first shaft terminal 284, which are selected targets to be measured, from the input and output terminals 291 and 292, and may turn on the second conversion switches 226 to 228 to ground the first winding wire 281, the third winding wire 283, and the second shaft terminal 285 through the reference impedance 293.

Here, the reference impedance 293 may be 50Ω, which, however, is illustrative, and it will be obvious to those skilled in the art that the actual value of the reference impedance 293 is not limited thereto.

The reason that the first conversion switches are turned off to disconnect the other terminals, excluding the two terminals, which are targets to be measured, from the input and output terminals and the second conversion switches are turned on to ground the other terminals through the reference impedance is to remove the effects caused by coupling and reflection that occur at the other terminals.

Hereinafter, an example in which two terminals are selected and measured from the five-terminal network of the three-phase motor 280 will be described with reference to Table 1.

Table 1 shows an example in which the apparatus for extracting the parameters of the three-phase motor according to the embodiment of the present disclosure selects and measures two terminals from the five-terminal network.

TABLE 1

|  | First port | Second port |
| --- | --- | --- |
| Measurement 1 | First shaft terminal | Second shaft terminal |
| Measurement 2 | First shaft terminal | First winding wire (U-phase) |
| Measurement 3 | First shaft terminal | Second winding wire (V-phase) |
| Measurement 4 | First shaft terminal | Third winding wire (W-phase) |
| Measurement 5 | Second shaft terminal | First winding wire (U-phase) |
| Measurement 6 | Second shaft terminal | Second winding wire (V-phase) |
| Measurement 7 | Second shaft terminal | Third winding wire (W-phase) |
| Measurement 8 | First winding wire (U-phase) | Second winding wire (V-phase) |
| Measurement 9 | First winding wire (U-phase) | Third winding wire (W-phase) |
| Measurement 10 | Second winding wire (V-phase) | Third winding wire (W-phase) |

For example, two terminals may be selected from among the first and second shaft terminals and the first to third winding wires, which constitute the five-terminal network of the three-phase motor, and may be connected to first and second ports of each of the input and output terminals in order to measure the voltage and current of the two terminals. Here, the first port may be one side of each of the input and output terminals (for example, positive (+) input and output terminals), and the second port may be the other side of each of the input and output terminals (for example, negative (−) input and output terminals).

Referring back to FIG. 2, the parameter extraction unit 240 may extract input impedance parameters of the five-terminal network using the terminal voltage values and the terminal current values measured by the measurement unit 210.

For example, the input impedance parameters of the five-terminal network may be defined by Equation 1.

[Equation 1]

$$\begin{bmatrix} V_{shaft\,1} \\ V_{shaft\,1} \\ V_U \\ V_V \\ V_W \end{bmatrix} = \begin{bmatrix} z_{11} & z_{12} & z_{13} & z_{14} & z_{15} \\ z_{21} & z_{22} & z_{23} & z_{24} & z_{25} \\ z_{31} & z_{32} & z_{33} & z_{34} & z_{35} \\ z_{41} & z_{42} & z_{43} & z_{44} & z_{45} \\ z_{51} & z_{52} & z_{53} & z_{54} & z_{55} \end{bmatrix} \begin{bmatrix} I_{shaft\,1} \\ I_{shaft\,1} \\ I_U \\ I_V \\ I_W \end{bmatrix} \Rightarrow V = ZI$$

Here, V indicates terminal voltages, I indicates terminal currents, Z indicates input impedance parameters of the five-terminal network, shaft 1 and 2 indicate first and second shaft terminals, and U, V, and W indicate phase terminals of the first to third winding wires.

The measurement unit 210 may measure terminal voltages and terminal currents output from the two terminals selectively connected as shown in FIG. 2, and the parameter extraction unit 240 may substitute the voltage and current values, measured by the measurement unit 210, into Equation 1, which is a determinant, to extract input impedance parameters of the five-terminal network.

In addition, the parameter extraction unit 240 may extract conversion parameters including voltage and current transfer matrices in a common mode, in which the first to third winding wires are commonly connected to the input terminal 291 and the output terminal 292, and in a differential mode, in which the first to third winding wires are differentially connected to the input terminal and the output terminal.

The reason that conversion parameters including voltage and current transfer matrices in each of the common mode and the differential mode are extracted is to extract data in which electrical noise is transferred to the opposite shaft ends in the common mode and in the differential mode.

The common mode and the differential mode will be described in detail with reference to FIGS. 3 and 4.

Figure 3:
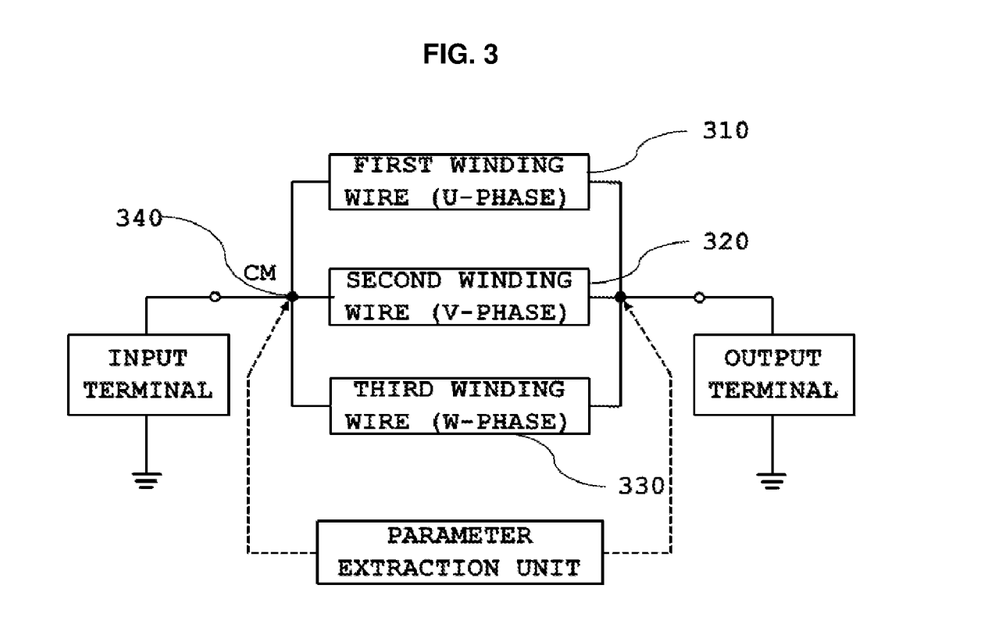
FIG. 3 is a schematic diagram showing an embodiment in which the apparatus for extracting impedance parameters of the three-phase motor according to the present disclosure measures voltage and current in a common mode.

FIG. 3 is a schematic diagram showing an embodiment in which the apparatus for extracting impedance parameters of the three-phase motor according to the present disclosure extracts voltage and current in the common mode.

In the common mode, one side of each of the input and output terminals (for example, positive (+) input and output terminals) is commonly connected to first to third winding wires 310 to 330, which are connected to each other in parallel, and the parameter extraction unit may extract voltage and current in the common mode 340.

Figure 4:
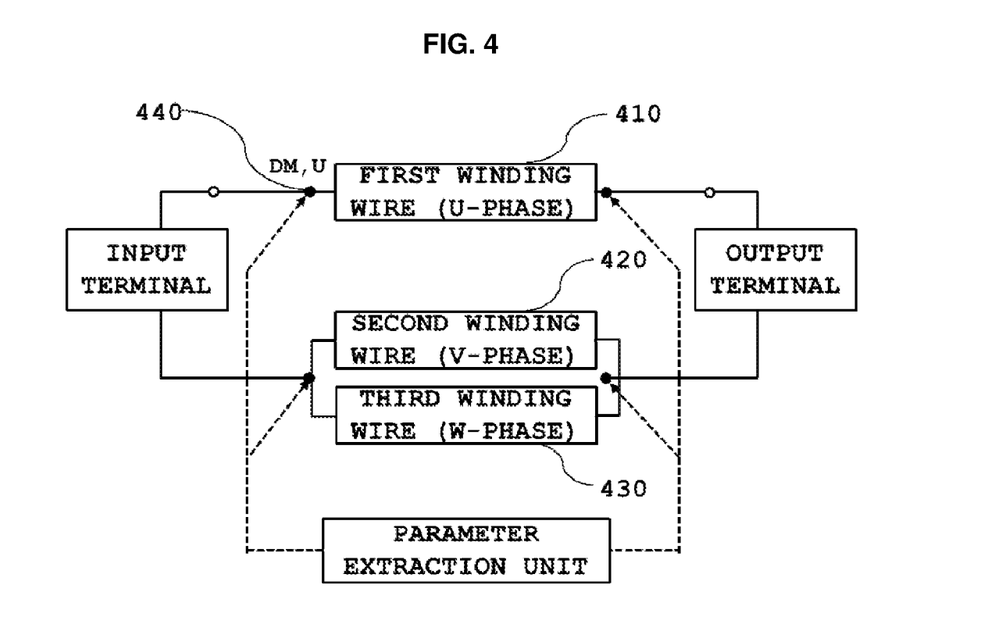
FIG. 4 is a schematic diagram showing an embodiment in which the apparatus for extracting impedance parameters of the three-phase motor according to the present disclosure measures voltage and current in a differential mode.

FIG. 4 is a schematic diagram showing an embodiment in which the apparatus for extracting impedance parameters of the three-phase motor according to the present disclosure extracts voltage and current in the differential mode.

In the differential mode, one side of each of the input and output terminals (for example, positive (+) input and output terminals) is connected to one of first to third winding wires 410 to 430, e.g. the first winding wire 410, and the other side of each of the input and output terminals (for example, negative (−) input and output terminals) is connected to the other two winding wires 420 and 430, which are connected to each other in parallel. The parameter extraction unit may extract voltage and current in the U-phase differential mode 440.

Here, a voltage transfer matrix and a current transfer matrix for converting the terminal voltage and the terminal current of each of the first to third winding wires to the relationship of voltage and current in the common mode and the differential mode based on the structural symmetry of the first to third winding wires may be defined by Equation 2.

$$\begin{bmatrix} V_{CM} \\ V_{DM,U} \\ V_{DM,V} \end{bmatrix} = \begin{bmatrix} \frac{1}{3} & \frac{1}{3} & \frac{1}{3} \\ 1 & \frac{-1}{2} & \frac{-1}{2} \\ \frac{-1}{2} & 1 & \frac{-1}{2} \end{bmatrix} \begin{bmatrix} V_U \\ V_V \\ V_W \end{bmatrix}$$ [Equation 2]

$$\begin{bmatrix} I_{CM} \\ I_{DM,U} \\ I_{DM,V} \end{bmatrix} = \begin{bmatrix} 1 & 1 & 1 \\ \frac{1}{2} & \frac{-1}{4} & \frac{-1}{4} \\ \frac{-1}{4} & \frac{1}{2} & \frac{-1}{4} \end{bmatrix} \begin{bmatrix} I_U \\ I_V \\ I_W \end{bmatrix}$$

Here, $V_{CM}$ and $I_{CM}$ indicate voltage and current in the common mode, $V_{DM}$ and $I_{DM}$ indicate voltage and current in the differential mode, DM,U indicates a U-phase differential mode, and DM,V indicates a V-phase differential mode.

Meanwhile, the conversion parameters, extracted by the parameter extraction unit 240, may include the relationship of voltage and current of the opposite shaft ends in the voltage and current transfer matrices in each of the common mode and the differential mode, defined by Equation 2. The reason for this is to extract data in which electrical noise is transferred to the opposite shaft ends in the common mode and in the differential mode, as previously described. The conversion parameters may be defined by Equation 3.

$$\begin{bmatrix} V_{shaft\,1} \\ V_{shaft\,1} \\ V_{CM} \\ V_{DM,U} \\ V_{DM,V} \end{bmatrix} = \begin{bmatrix} 1 & 0 & 0 & 0 & 0 \\ 0 & 1 & 0 & 0 & 0 \\ 0 & 0 & \frac{1}{3} & \frac{1}{3} & \frac{1}{3} \\ 0 & 0 & 1 & \frac{-1}{2} & \frac{-1}{2} \\ 0 & 0 & \frac{-1}{2} & 1 & \frac{-1}{2} \end{bmatrix} \begin{bmatrix} V_{shaft\,1} \\ V_{shaft\,1} \\ V_U \\ V_V \\ V_W \end{bmatrix} \Rightarrow V_M = M_V V$$ [Equation 3]

$$\begin{bmatrix} I_{shaft\,1} \\ I_{shaft\,1} \\ I_{CM} \\ I_{DM,U} \\ I_{DM,V} \end{bmatrix} = \begin{bmatrix} 1 & 0 & 0 & 0 & 0 \\ 0 & 1 & 0 & 0 & 0 \\ 0 & 0 & 1 & 1 & 1 \\ 0 & 0 & \frac{1}{2} & \frac{-1}{4} & \frac{-1}{4} \\ 0 & 0 & \frac{-1}{4} & \frac{1}{2} & \frac{-1}{4} \end{bmatrix} \begin{bmatrix} I_{shaft\,1} \\ I_{shaft\,1} \\ I_U \\ I_V \\ I_W \end{bmatrix} \Rightarrow I_M = M_I I$$

Here, V indicates terminal voltage, I indicates terminal currents, shaft 1 and 2 indicate first and second shaft terminals, $V_{CM}$ and $I_{CM}$ indicate voltage and current in the common mode, $V_{DM}$ and $I_{DM}$ indicate voltage and current in the differential mode, DM,U indicates a U-phase differential mode, and DM,V indicates a V-phase differential mode. $V_M$ indicates voltage in a mixed mode, $I_M$ indicates current in the mixed mode, $M_V$ indicates conversion parameters including voltage transfer matrices in the common mode and the differential mode, and $M_I$ indicates conversion parameters including current transfer matrices in the common mode and the differential mode.

The terminal voltage and the terminal current of the five-terminal network are converted to the relationship of voltage and current in the common mode and the differential mode through the conversion parameters defined by Equation 3.

Hereinafter, an embodiment in which impedance parameters in a mixed mode are calculated to extract data in which electrical noise is transferred to the opposite shaft ends 284 and 285 in the common mode and in the differential mode using the input impedance parameters and the conversion parameters, extracted by the parameter extraction unit 240, will be described with reference to FIG. 2.

The parameter calculation unit 250 may calculate impedance parameters in a mixed mode, in which transfer impedance components for the opposite shaft ends in the common mode and the differential mode are mixed, using the input impedance parameters and the conversion parameters extracted by the parameter extraction unit 240, as expressed in Equation 4.

$$Z_M = M_V Z M_I^{-1}$$ [Equation 4]

Here, $Z_M$ indicates impedance parameters in the mixed mode, $M_V$ indicates conversion parameters including voltage transfer matrices in the common mode and the differential mode, $M_I$ indicates conversion parameters including current transfer matrices in the common mode and the differential mode, and Z indicates input impedance parameters of the five-terminal network.

The data extraction unit 260 may extract data in which the transfer impedance components for the opposite shaft ends in the common mode and the differential mode are mixed from the impedance parameters in the mixed mode.

An example for extracting data in which the transfer impedance components for the opposite shaft ends in the common mode and the differential mode are mixed will be described in more detail with reference to FIG. 5.

Figure 5:
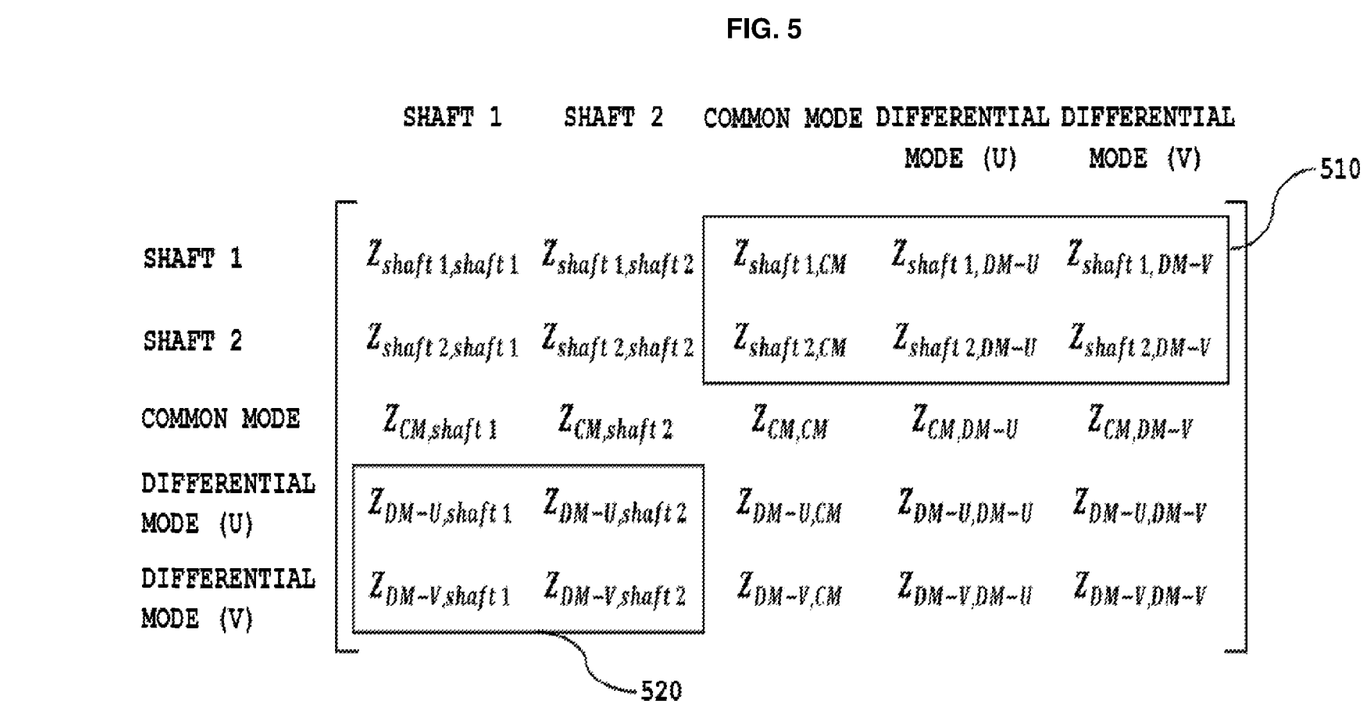
FIG. 5 is a view showing an example of impedance parameters in a mixed mode.

FIG. 5 is a view showing an example of impedance parameters in the mixed mode.

Referring to FIG. 5, it can be seen that the impedance parameters in the mixed mode act as factors that affect the opposite shaft ends in the common mode and the differential mode.

Here, data 510 and 520, shown by solid lines, indicate data that affect the opposite shaft ends (the first shaft terminal and the second shaft terminal) in the common mode and/or the differential mode. In other words, the shown data are data about electrical noise transferred to the opposite shaft ends. The data extraction unit extracts data in which the transfer impedance components for the opposite shaft ends in the common mode and the differential mode are mixed (see the data 510 and 520, shown by the solid lines in FIG. 5).

A motor designer or user may estimate the extent of interference of the extracted electrical noise transferred to the opposite shaft ends in the common mode and the differential mode through the impedance parameters, which is helpful in designing the electromagnetic compatibility (EMC) of the motor. In addition, not only transfer parameters between the electrical noise and the shaft but also parameters related to noise generated from the winding wires of the motor in the common mode and the differential mode are extracted. Consequently, it is possible to analyze overall conductive noise generated from the motor.

The present disclosure may be implemented as code that can be written on a non-transitory computer-readable medium and thus read by a computer. The computer-readable medium may be any type of recording device in which data is stored in a computer-readable manner. The computer-readable medium may include, for example, a hard disk drive (HDD), a solid-state disk (SSD), a silicon disk drive (SDD), a read-only memory (ROM), a random access memory (RAM), a compact disc read-only memory (CD-ROM), a magnetic tape, a floppy disk, and an optical data storage device.

As is apparent from the above description, at least one embodiment of the present disclosure has the following effects.

It is possible to extract electrical noise generated from a three-phase motor in a common mode and a differential mode and to extract the extent to which the electrical noise is transferred to opposite shaft ends as parameters.

In addition, not only transfer parameters between the electrical noise and the shaft but also parameters related to noise generated from winding wires of the motor in a common mode and a differential mode are extracted. Consequently, it is possible to analyze overall conductive noise generated from the motor.

It will be appreciated by those skilled in the art that effects achievable through the present disclosure are not limited to what have been particularly described hereinabove and other effects of the present disclosure will be more clearly understood from the above detailed description.

The above detailed description is not to be construed as limiting the present disclosure in any aspect, and is to be considered by way of example. The scope of the present disclosure should be determined by reasonable interpretation of the accompanying claims, and all equivalent modifications made without departing from the scope of the present disclosure should be understood to be included in the following claims.

What is claimed is:

1. A method of extracting impedance parameters of a three-phase motor constituted by a five-terminal network having first to third winding wires and opposite shaft ends, the method comprising the steps of:

connecting two terminals, selected from among the first to third winding wires and the opposite shaft ends of the three-phase motor, to an input terminal and an output terminal in order to measure voltage and current of the two terminals and to extract input impedance parameters of the five-terminal network;

extracting conversion parameters comprising voltage and current transfer matrices in a common mode, in which the first to third winding wires are commonly connected to the input terminal and the output terminal, and in a differential mode, in which the first to third winding wires are differentially connected to the input terminal and the output terminal; and calculating impedance parameters in a mixed mode, in which transfer impedance components for the opposite shaft ends in the common mode and the differential mode are mixed, using the input impedance parameters and the conversion parameters, extracted at the steps of connecting the two terminals and extracting the conversion parameters.

2. The method according to claim 1, wherein in the step of calculating the impedance parameters, the impedance parameters in the mixed mode are calculated using an equation:

$$Z_M = M_V Z M_I^{-1}$$

where $Z_M$ indicates impedance parameters in the mixed mode, $M_V$ indicates conversion parameters comprising voltage transfer matrices in the common mode and the differential mode, $M_I$ indicates conversion parameters comprising current transfer matrices in the common mode and the differential mode, and Z indicates input impedance parameters of the five-terminal network.

3. The method according to claim 1, wherein the step of connecting the two terminals further comprises performing control to selectively switch a plurality of first conversion switches for connecting the first to third wires and the opposite shaft ends of the three-phase motor to the input terminal and the output terminal in order to interrupt or allow a flow of current therebetween.

4. The method according to claim 3, wherein the step of connecting the two terminals further comprises turning on a plurality of second conversion switches to ground the other terminals of the five-terminal network of the three-phase motor, excluding the two terminals, which are selected targets to be measured, through a reference impedance.

5. The method according to claim 1, further comprising extracting data in which the transfer impedance components for the opposite shaft ends in the common mode and the differential mode are mixed from the impedance parameters in the mixed mode.

6. The method according to claim 5, further comprising transmitting the data, extracted in the step of extracting data, to a display unit.

7. A non-transitory computer-readable recording medium containing program instructions executed by a processor, the computer readable medium comprising:

program instructions that connect two terminals, selected from among first to third winding wires and opposite shaft ends of a three-phase motor, to an input terminal and an output terminal in order to measure voltage and current of the two terminals and to extract input impedance parameters of a five-terminal network;

program instructions that extract conversion parameters comprising voltage and current transfer matrices in a common mode, in which the first to third winding wires are commonly connected to the input terminal and the output terminal, and in a differential mode, in which the first to third winding wires are differentially connected to the input terminal and the output terminal; and program instructions that calculate impedance parameters in a mixed mode, in which transfer impedance components for the opposite shaft ends in the common mode and the differential mode are mixed, using the input impedance parameters and the conversion parameters, extracted at the steps of connecting the two terminals and extracting the conversion parameters.

8. An apparatus for extracting impedance parameters of a three-phase motor constituted by a five-terminal network having first to third winding wires and opposite shaft ends, the apparatus comprising:

a measurement unit for connecting two terminals, selected from among the first to third winding wires and opposite shaft ends of the three-phase motor, to an input terminal and an output terminal in order to measure voltage and current of the two terminals;

a parameter extraction unit for extracting input impedance parameters of the five-terminal network and conversion parameters comprising voltage and current transfer matrices in a common mode, in which the first to third winding wires are commonly connected to the input terminal and the output terminal, and in a differential mode, in which the first to third winding wires are differentially connected to the input terminal and the output terminal; and a parameter calculation unit for calculating impedance parameters in a mixed mode, in which transfer impedance components for the opposite shaft ends in the common mode and the differential mode are mixed, using the input impedance parameters and the conversion parameters, extracted by the parameter extraction unit.

9. The apparatus according to claim 8, wherein the parameter calculation unit calculates the impedance parameters in the mixed mode using an equation:

$$Z_M = M_V Z M_I^{-1}$$

where $Z_M$ indicates impedance parameters in the mixed mode, $M_V$ indicates conversion parameters comprising voltage transfer matrices in the common mode and the differential mode, $M_I$ indicates conversion parameters comprising current transfer matrices in the common mode and the differential mode, and Z indicates input impedance parameters of the five-terminal network.

10. The apparatus according to claim 8, further comprising a switching unit comprising a plurality of first conversion switches for connecting the first to third wires and the opposite shaft ends of the three-phase motor to the input terminal and the output terminal, the first conversion switches being selectively switched.

11. The apparatus according to claim 10, further comprising a controller for performing control to switch the first conversion switches such that the input terminal and the output terminal are selectively disconnected from or connected to the first to third wires and the opposite shaft ends of the three-phase motor.

12. The apparatus according to claim 10, wherein the switching unit comprises a plurality of second conversion switches configured to be switched in order to ground the other terminals of the five-terminal network of the three-phase motor, excluding the two terminals, which are selected targets to be measured, through a reference impedance.

13. The apparatus according to claim 8, further comprising a data extraction unit for extracting data in which the transfer impedance components for the opposite shaft ends in the common mode and the differential mode are mixed from the impedance parameters in the mixed mode.

14. The apparatus according to claim 13, further comprising a display unit for displaying the data received from the data extraction unit.

* * * * *